(12) United States Patent
Okushima et al.

(10) Patent No.: US 7,862,761 B2
(45) Date of Patent: Jan. 4, 2011

(54) PATTERN FORMING METHOD AND PATTERN FORMING APPARATUS

(75) Inventors: Shingo Okushima, Tokyo (JP); Junichi Seki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 216 days.

(21) Appl. No.: 11/753,106

(22) Filed: May 24, 2007

(65) Prior Publication Data

US 2007/0278712 A1  Dec. 6, 2007

(30) Foreign Application Priority Data

May 31, 2006  (JP) ............... 2006-151009

(51) Int. Cl.
*B29C 43/02* (2006.01)
*B29C 71/00* (2006.01)

(52) U.S. Cl. ............... 264/319; 264/326; 425/375

(58) Field of Classification Search ............... None
See application file for complete search history.

(56) References Cited

U.S. PATENT DOCUMENTS

| 2004/0008334 | A1 | 1/2004 | Sreenivasan et al. |
| 2004/0017077 | A1 | 1/2004 | Vyse et al. |
| 2006/0036051 | A1* | 2/2006 | Xu et al. ............... 526/279 |

FOREIGN PATENT DOCUMENTS

WO  2005120834 A2  12/2005

OTHER PUBLICATIONS

M. Colburn et al., "Step and Flash Imprint Lithography: A New Approach to High-Resolution Patterning," Processings of the SPIE's 24th International Symposium on Microlithography: Emerging Lithographic Technologies III, Santa Clara, CA, vol. 3676, Part One, pp. 379-389 (Mar. 1999).
Stephan Y. Chou et al., "Imprint of Sub-25 nm Vias and Trenches in Polymers," 67(21) Appl. Phys. Lett., 3114-16 (1995).
Ki-don Kim et al., "Minimization of Residual Layer Thickness by Using Optimized Dispensing Method in S-FIL Process," Digest of Papers of The 4th International Conference on Nanoimprint and Nanoimprint Technology, 20P-5-39, pp. 106-107 (Oct. 2005).
Ki-don Kim et al., "Minimization of Residual Layer Thickness by Using the Optimized Dispensing Method in S-FIL Process," 83 Microelectronic Engineering 847-50 (2006).
European Search Report and Search Opinion in Application No. EP 07109107 (Nov. 27, 2007).

* cited by examiner

*Primary Examiner*—Jennifer K Michener
*Assistant Examiner*—Magali P Slawski
(74) *Attorney, Agent, or Firm*—Fitzpatrick, Cella, Harper & Scinto (57) ABSTRACT

A pattern forming method for forming a pattern on a pattern forming material on a substrate by using an imprint pattern provided to a mold is constituted by preparing a substrate having thereon a pattern forming area, disposing the pattern forming material placed in an uncured state in the pattern forming area in a dispersion state at a plurality of positions at different intervals, and curing the pattern forming material in a state in which the pattern forming material is deformed in a shape corresponding to a shape of the imprint pattern provided to the mold.

4 Claims, 6 Drawing Sheets

PATTERN FORMING METHOD AND PATTERN FORMING APPARATUS

FIELD OF THE INVENTION AND RELATED ART

The present invention relates to a pattern forming method for forming a pattern on a pattern forming material on a substrate by using an imprint pattern provided to a mold (or a template) and also relates to a pattern forming apparatus.

In recent years, e.g., as proposed in Appl. Phys. Lett., Vol. 67, Issue 21, pp. 3114-3116 (1995) by Stephan Y. Chou et al., fine processing technology for transferring a minute structure provided on a mold onto a member to be processed such as a resin material or a metal material has been developed and has received attention. This technology is called nanoimprint or nanoembossing and provides a processing resolution on the order of several nanometers. For this reason, the technology has been expected to be applied to next-generation semiconductor manufacturing technologies in place of light exposure devices such as a stepper, a scanner, and the like. Further, the nanoimprint technology is capable of collectively processing a three-dimensional structure at a wafer level, so that the technology has been expected to be applied to production technologies of optical devices such as photonic crystal, and production technologies of biochips such as μ-TAS (Micro Total Analysis System).

As the nanoimprint technology, in Processings of the SPIE's 24th International Symposium on Microlithography: Emerging Lithographic Technologies III, Santa Clara, Calif., Vol. 3676, Part One, pp. 379-389, March (1999), the following method has been proposed.

First, a minute structure is formed at a surface of a quartz substrate to prepare a mold.

Further, a work is prepared by applying a liquid ultraviolet (UV) curable resin material dropwise onto a processing area of a substrate.

Next, the mold is aligned with the work to fill the UV curable resin material in a spacing between the mold and the substrate. Thereafter, the resultant structure is irradiated with UV light to cure the UV curable resin material.

Finally, the mold is removed from the work.

Further, U.S. Patent Application Publication No. US 2004/017077 has proposed a method of curing a UV curable resin material in a state in which a mold and a substrate are control to have a desired distance therebetween.

In Digest of Papers of The 4th International Conference on Nanoimprint and Nanoimprint Technology, 20P-5-39, Nara, Japan, October (2005), an application method of a droplet-like resin material in which control of an amount of a resin material is made so as not to cause excess and deficiency due to vaporization of the resin material depending on location when the resin material is filled has been proposed. In this application method, a plurality of resin material droplets is applied and an amount of a resin material during application is adjusted in consideration of the order of application of respective resin material droplets and an amount of evaporation of the droplets until the droplets are filled.

Incidentally, with an increasing demand for recent high-resolution fine processing, an amount of a resin material is required to be prevented from being excess and deficient depending on location in order to effect higher precise processing when the resin material is filled even in the case where the above described imprint processing technology is industrially applied. For example, excess and deficiency of a resin material can be caused depending on location by evaporation of a liquid curable resin material, a shape of a mold, a strain of a substrate, or the like when the resin material is filled between the mold and the substrate, thus resulting in a decreased processing accuracy in some cases.

This will be described more specifically below by taking the case of applying the above described imprint processing technology to the semiconductor manufacturing as an example.

A mold has an imprint shape (recess-projection shape) having a height (or depth) of, e.g., several tens of nanometers, as a desired processing pattern. Further, in many cases, the mold causes waving, strain, etc. Similarly, the substrate also causes waving, strain, etc., and in addition, has a structure having a height of, e.g., several tens of nanometers by a previous step. Further, when resin material droplets are applied, a difference in amount of the resin material can be locally caused by evaporation of the resin material.

From a viewpoint of critical dimension (CD), the above described processing technology requires a thin resin material layer having a thickness of several tens of nanometers to several hundreds of nanometers. In such very small amounts of the resin material, due to the above described mold shape, substrate strain, resin material evaporation, or the like, there occurs locally insufficient filling of the resin material or an unacceptable irregularity in thickness of the resin material layer in some cases. For this reason, it is necessary to control the resin material amount so as not to cause local excess and deficiency of the resin material amount depending on the mold shape, the substrate strain, or the resin material evaporation. With respect to such a problem that the excess and deficiency of the resin material are caused depending on location during the filling of the resin material by the evaporation of the resin material, for example, the droplet-like resin material application method as described in the above mentioned Digest of Papers of the 4th International Conference on Nanoimprint and Nanoprint Technology has been known.

However, by this method, it is essentially difficult to continuously and precisely control a very small amount of liquid. Further, the method is accompanied with such a problem that an error in amount of the liquid or an increase in cost due to condition setting for precise temperature control for preventing the resin material amount error.

SUMMARY OF THE INVENTION

The present invention has been accomplished in view of the above described problem. A principal object of the present invention is to provide a pattern forming method and a pattern forming apparatus which have solved the above described problems.

According to an aspect of the present invention, there is provided a pattern forming method for forming a pattern on a pattern forming material on a substrate by using an imprint pattern provided to a mold, the pattern forming method comprising:

preparing a substrate having thereon a pattern forming area;

disposing the pattern forming material placed in an uncured state in the pattern forming area in a dispersion state at a plurality of positions at different intervals; and curing the pattern forming material in a state in which the pattern forming material is deformed in a shape corresponding to a shape of the imprint pattern provided to the mold.

In the pattern forming method, the pattern forming material can be disposed in an equal amount at each of the plurality of positions at the different intervals or in mutually different amounts at the plurality of positions at the different intervals.

According to another aspect of the present invention, there is provided a pattern forming apparatus for effecting the pattern forming method described above, comprising:

a mold holding portion for holding the mold;
a substrate holding portion for holding the substrate; and
an application portion for applying the pattern forming material onto the substrate.

According to a further aspect of the present invention, there are provided pattern transfer methods and pattern transfer apparatuses (1) to (10) constituted as follows.

(1) A pattern transfer method for transferring a shape of a mold onto a cured resin material on a substrate by filling and curing a liquid curable resin material between the mold and the substrate, wherein an application position of the liquid curable resin material is controlled so as not to cause excess and deficiency of an amount of the resin material depending on filling location when the resin material is filled between the mold and the substrate.

(2) In the pattern transfer method (1), the control of the application position of the liquid curable resin material is effected depending on an evaporation amount of the resin material.

(3) In the pattern transfer method (1), the control of the application position of the resin material is effected depending on a shape of the mold and/or a shape of the substrate.

(4) In the pattern transfer method (1), the control of the application position of the resin material is effected depending on superposition of three factors including the evaporation amount of the resin material, the shape of the mold, and the shape of the substrate.

(5) In any one of the pattern transfer methods (1) to (4) described above, the control of the application position of the liquid curable resin material is effected by adjusting application positions of droplets of the liquid curable resin material applied in the same amount at the respective application positions.

(6) A pattern transfer apparatus for transferring a shape of a mold onto a cured resin material on a substrate by filling and curing a liquid curable resin material between the mold and the substrate, wherein the pattern transfer apparatus includes an application position control means for controlling an application position of the liquid curable resin material so as not to cause excess and deficiency of an amount of the resin material depending on filling location when the resin material is filled between the mold and the substrate.

(7) In the pattern transfer apparatus (6), the application position control means is constituted so as to adjust the application position of the liquid curable resin material depending on an evaporation amount of the resin material.

(8) In the pattern transfer apparatus (6), the application position control means is constituted so as to adjust the application position of the resin material depending on a shape of the mold and/or a shape of the substrate.

(9) In the pattern transfer apparatus (6), the application position control means is constituted so as to adjust the application position of the resin material depending on superposition of three factors including the evaporation amount of the resin material, the shape of the mold, and the shape of the substrate.

(10) In any one of the pattern transfer apparatuses (6) to (9) described above, the application position control means is constituted so as to adjust application positions of droplets of the liquid curable resin material applied in the same amount at the respective application positions.

In the present invention, in order to transfer an imprint pattern provided to the mold onto the resin material on the substrate, the following method may be employed. That is, in an area on the substrate in which the imprint pattern provided to the mold is to be transferred, a resin material placed in an uncured state is disposed in a dispersion state at a plurality of positions on the substrate and then the resin material and the mold are caused to contact each other, followed by curing the resin material. In this case, at each of the plurality of positions on the substrate, the resin material is disposed in an equal amount with a different interval with respect to an adjacent position.

Herein, the term "dispersion state" also includes the case where centers of application positions of the resin material are located in a discrete state. In other words, during an imprint operation, respective portions of the resin material are not necessarily required to be physically apart from each other but may also contact each other. Further, at each of the plurality of positions on the substrate, the resin material is not necessarily required to be disposed in the equal amount.

According to the present invention, during the imprint operation, it is possible to effect control for uniformizing the amount of the resin material interposed between the mold and the substrate.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

First Embodiment

A pattern forming method, according to this embodiment, for forming a pattern on a pattern forming material on a substrate by using an imprint pattern provided to a mold has the following features.

First, a substrate having thereon a pattern forming area is prepared and in the pattern forming area, a pattern forming material placed in an uncured state is disposed in a dispersion state at a plurality of positions at different intervals. As the pattern forming material, a photocurable resin material or a thermosetting resin material can be used.

Thereafter, the mold and the substrate are disposed opposite to each other so as to be placed in a state in which the pattern forming material is interposed between the mold and the substrate. Then a gap between the mold and the substrate is gradually decreased, so that the pattern forming material is deformed in a shape corresponding to a shape of the imprint pattern provided to the mold and is then cured. In order to cure the pattern forming material, irradiation with ultraviolet (UV) rays or application of heat is effected depending on a characteristic of the resin material as the pattern forming material.

With respect to a relative position between the mold and the substrate (in an in-plane direction of the substrate), it is preferable that the pattern forming material is cured while position control is effected.

In the case where the pattern forming material is disposed on the substrate in a dot-like shape at a plurality of positions, it takes a predetermined time until the pattern forming material is disposed so as to correspond to an entire surface of an imprint pattern area of the mold.

In such a case, there is a possibility of an occurrence of excess and deficiency in amount of the pattern forming material in an in-plane direction of the area during an imprint operation when the pattern forming material contains a volatile component or evaporates.

A period of time from the moment at which the pattern forming material is disposed on the substrate until the pattern forming material is deformed depending on the shape of the imprint pattern is taken into consideration. In an area requiring a shorter period of time, the pattern forming material is disposed at a first interval. In an area requiring a longer period of time, the pattern forming material is disposed at a second interval shorter than the first interval. As a result, when the pattern forming material is cured, it is possible to effect control for uniformizing an amount of the pattern forming material in the in-plane direction in the imprint pattern area.

Further, also in the case where projections and recesses of the imprint pattern have a difference in density in the in-plane direction, there is a possibility of an occurrence of excess and deficiency in amount of the pattern forming material in the in-plane direction during the imprint operation if the pattern forming material is dispersed and disposed in the same amount and at the same interval. For example, in the case where a recess area in which the recesses are disposed extends continuously in a planar dimension larger than that of a peripheral area, a large amount of the pattern forming material to be disposed in the recess area is required. In such a case, the interval of arrangement of the pattern forming material in the recess area is decreased.

Accordingly, in the case where a step of reading information about the imprint pattern of the mold is introduced and the difference in density exceeds a predetermined (preset) threshold value before the pattern forming interval is applied onto the substrate, i.e., in the case where the recess area is present in a very large planar dimension in the imprint pattern area, it is preferable that the interval of arrangement of the pattern forming material is decreased.

A part for applying the resin material as the pattern forming material onto the substrate is called a dispenser. In the present invention, by changing the interval of arrangement of the resin material while keeping an amount of the resin material ejected from the dispenser at a constant value, a degree of the excess and deficiency in amount of the resin material in the imprint pattern area during the imprint operation can be reduced. In the present invention, it is also possible to change an application amount itself of the resin material applied at a time depending on an arrangement position of the resin material on the substrate. More specifically, it is also preferable that an equal amount of the pattern forming material is disposed at each of the plurality of positions on the substrate at different intervals. Further, it is also possible to dispose the pattern forming material at each of the plurality of positions on the substrate in a different amount at different intervals.

The pattern forming material is disposed at different intervals at least in the following manners 1) and 2).

1) The pattern forming material is applied in a dot shape at different intervals between adjacent two dots.

2) An interval is different between a plurality of areas each constituted by a plurality of dots. That is, the pattern forming material is disposed at a first interval in a first area constituted by a plurality of dots and disposed at a second interval in a second area constituted by a plurality of dots.

Accordingly, the present invention also includes the case where when the above described pattern forming material is provided in a dispersion state at different intervals in a direction of one line, the pattern forming material is provided at an equal interval between adjacent dots of a plurality of adjacent lines.

In a preferred embodiment, when a liquid resin material as the pattern forming material is disposed on the substrate, an application position of the liquid resin material is controlled. In the case where the dispenser is not capable of applying the resin material at a time in a planar dimension corresponding to a size of the imprint pattern area of the mold, the pattern forming material is disposed while the application position thereof is controlled to move the dispenser in, e.g., a first axis direction.

Second Embodiment

A pattern forming apparatus according to this embodiment is an apparatus for effecting pattern formation by the pattern forming method according to First Embodiment. Specifically, the pattern forming apparatus includes a mold holding portion for holding the mold described above, a substrate holding portion for holding the substrate described above, and an application portion for applying the above described pattern forming material on the substrate. Details of the pattern forming apparatus are described more specifically in Embodiments appearing hereinafter.

As described above, by employing such a constitution that the application position of the pattern forming material is controlled so as to less cause the excess and deficiency in resin material amount depending on location, it is possible to strictly control the resin material amount when the resin material is filled between the mold and the substrate.

Further, in the above described embodiments, it is possible to adopt a constitution for adjusting the application position based on a relationship between an application time of the resin material and an amount of evaporation of the resin material. As a result, it is possible to effect local control of the resin material amount with high accuracy even when a resin material which is liable to evaporate is used, thus resulting in precise processing.

Further, by adjusting the application position of the resin material depending on the mold shape or the substrate shape, it is possible to effect local control of the resin material amount with high accuracy to permit precise processing even when a mold having a complicated shape or a deformed substrate is used. It is also possible to effect precise processing by performing control so that the excess and deficiency in resin material amount is not caused depending on filling location by applying the resin material with adjustment of the application position without adjusting the liquid resin material amount which is not readily finely adjusted.

Hereinafter, the present invention will be described based on Embodiments.

Embodiment 1

In Embodiment 1, a constitutional example of an application position of a resin material in a pattern transfer apparatus to which the present invention is applied will be described.

Figure 1:
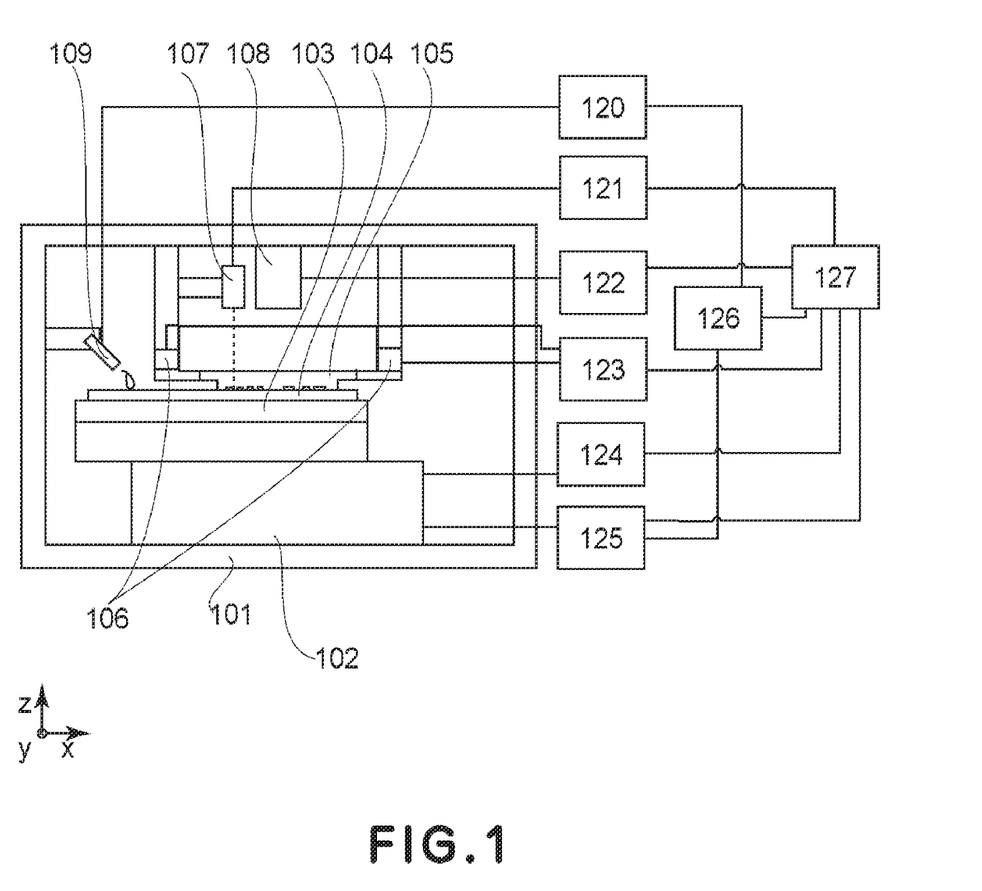
FIG. 1 is a schematic view for illustrating a constitution example of resin material application position control in pattern transfer in Embodiment 1 of the present invention.

FIG. 1 shows the constitutional example of the pressure processing apparatus in this embodiment.

As shown in FIG. 1, in the pattern transfer apparatus of this embodiment, a mold 105 and a substrate 104 are disposed opposite to each other. The mold 105 is formed of a transparent material and has a desired imprint pattern at a surface facing the substrate 104. The mold 105 is connected to a housing 101 via a load cell 106 and a member. The transparent material for the mold 105 can be appropriately selected from quartz, sapphire, $TiO_2$, SiN, etc. The surface of the mold 105 facing the substrate 104 is ordinarily subjected to release treatment by effecting treatment with a silane coupling agent or the like.

A scope 107 is constituted by a lens system and a CCD (charge coupled device) camera and acquires, as an image, information about the mold 105, the substrate 104, and a spacing therebetween.

At a portion of the housing 101 located opposite to the back surface of the mold 105, a UV light source 108 is disposed.

The substrate 104 is mounted on a stage 102 via a chuck 103. The stage 102 has movable directions with respect to six axes (x, y, z, θ, α and β) and is attached to the housing 101.

a dispenser 109 is attached so that it can be located opposite to an arbitrary position on the substrate 104.

a process control circuit 127 provides instructions to an application control circuit 120, a position detection circuit 121, an exposure amount control circuit 122, a pressure detection circuit 123, a pressure control circuit 124, a position control circuit 125, and an application position control circuit 126 to proceed with a process. Further, the process control circuit 127 receives output data from the above described circuits.

The application control circuit 120 controls the dispenser 109 so as to apply a photocurable resin material onto the substrate 104.

The position detection circuit 121 image-processes the image obtained through the scope 107 to calculate the positional relationship between the mold 105 and the substrate 104.

The exposure amount control circuit 122 controls the UV light source 108 to effect light exposure.

The pressure detection circuit 123 calculates a pressure exerted in the spacing between the mold 105 and the substrate 104 from a detection signal of the load cell 106 and a planar dimension of a portion to be processed.

The pressure control circuit 124 controls the stage 102 so that a desired pressure is exerted in the spacing between the mold 105 and the substrate 104.

The position control circuit 125 controls the stage 102 so that the mold 105 and the substrate 104 provide a desired positional relationship therebetween.

The application position control circuit 126 provides instructions about a control amount to the application control circuit 120 and the position control circuit 125 to control an application position of the resin material.

Incidentally, arrangements and modes of the respective mechanisms are not limited to those described in this embodiment but may also be modified into other constitutions. For example, the mold 105 can be moved in place of the substrate 104.

Next, the control of the application position of the resin material in this embodiment will be described.

Figure 2:
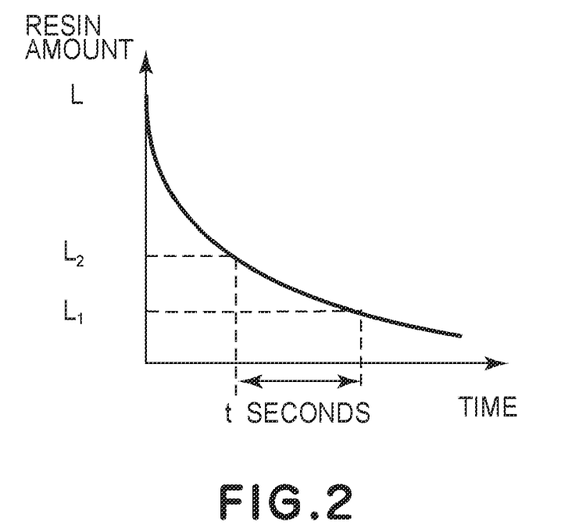
FIG. 2 is a graph for illustrating a rate of evaporation of an applied liquid (curable) resin material and a change with time thereof in Embodiment 1 of the present invention.

FIG. 2 shows a rate of evaporation of the applied liquid resin material and a change with time thereof.

When droplets of the resin material applied in a liquid amount $L_2$ takes t seconds until the droplets are filled, the liquid amount $L_2$ is decreased to $L_1$ by evaporation. For example, the amount of the resin material at the time of application is 200 pl.

FIGS. 3(a), 3(b), 4 and 5 are schematic views for illustrating this embodiment.

In this embodiment, the application position is controlled by taking an evaporation amount of the applied resin material into consideration.

Figure 3:
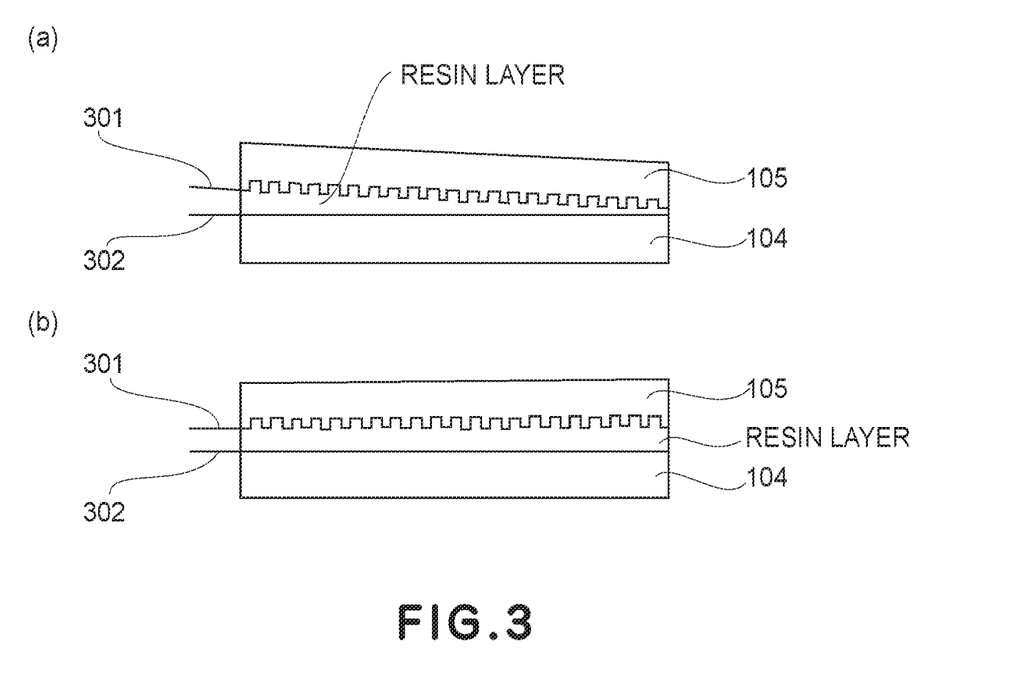
FIGS. 3(a), 3(b), 4, 5, 6(a) and 6(b) are schematic views each for illustrating a constitution example of resin material application position control in Embodiment 1 of the present invention.

FIG. 3(a) shows an example in which the resin material has evaporated in a right-hand area, so that a reference surface 301 of the mold 105 and a reference surface 302 of the substrate 104 are not parallel to each other. FIG. 3(b) shows an example in which the application position of the liquid resin material is controlled so as not to cause excess and deficiency in resin material amount depending on filling location when the liquid resin material is filled in the spacing between the mold 105 and the substrate 104, so that the reference surface 301 of the mold 105 and the reference surface 302 of the substrate 104 are parallel to each other.

Figure 4:
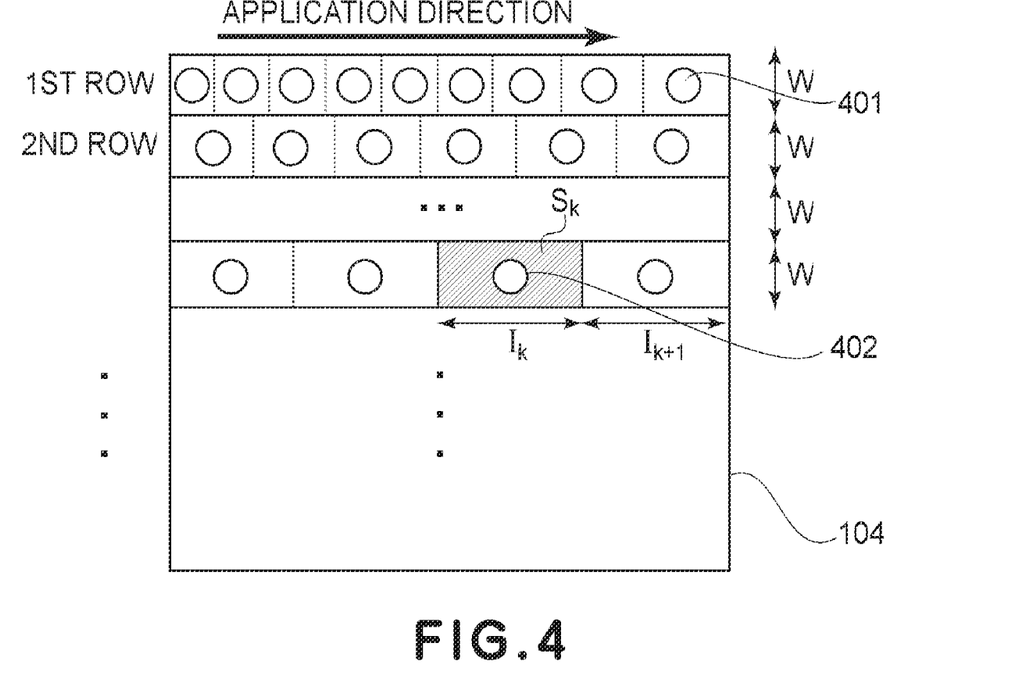

In this embodiment, for the sake of simplicity, the case where application of a liquid resin material 401 is performed so that droplets of the resin material 401 are arranged in a row in the same amount for each droplet and then a plurality of rows is arranged with a constant width w for each row as shown in FIG. 4 is considered.

First, a necessary amount causing no excess and deficiency in resin material amount depending on filling location when the resin material is filled in the spacing between the substrate 104 and the mold 105 is determined by the application position control circuit 126 on the basis of a balance between the rate of evaporation amount and the time from application to filling shown in FIG. 2.

In this embodiment, for example, the application position is determined in the following manner.

From an evaporation curve shown in FIG. 2, a time until a k-th applied droplet 402 of the resin material is filled is taken as $t_k$, and an amount of the k-th applied droplet 402 during the filling of the resin material is taken as $V(t_k)$. Further, a total area (planar dimension) of a processing surface is taken as S', and an average thickness of a resin material layer after the processing is taken as d.

In this case, a total amount (volume) $V_{all}$ of the resin material required for the processing can be represented by the following equation:

$$V_{all} = Sd = \sum_{k=1}^{n} V(t_k).$$

From this equation, a total number n of droplets of the resin material satisfying the equation is determined. If fractions are unacceptable, adjustment is made by a time until the resin material is filled.

Next, an assigned area $S_k$ of the k-th resin material droplet 402 can be represented by the following equation:

$$S_k = \frac{V(t_k)}{d}.$$

As shown in FIG. 4, each row has the equal with w, so that an assigned width $l_k$ of the k-th resin material droplet 402 can be represented by the following equation:

$$l_k = \frac{S_k}{w} = \frac{V(t_k)}{wd}.$$

From this equation, an interval between the k-th resin material droplet and a k+1-th resin material droplet is determined as $(l_k+l_{k+1})/2$.

Based on the thus determined application positions, the application position control circuit 126 provides instructions of the application control circuit 120 and the position control circuit 125, so that an equal amount of resin material droplet is successively applied by using the dispenser 109 and the stage 102 while the application position is controlled.

Figure 5:
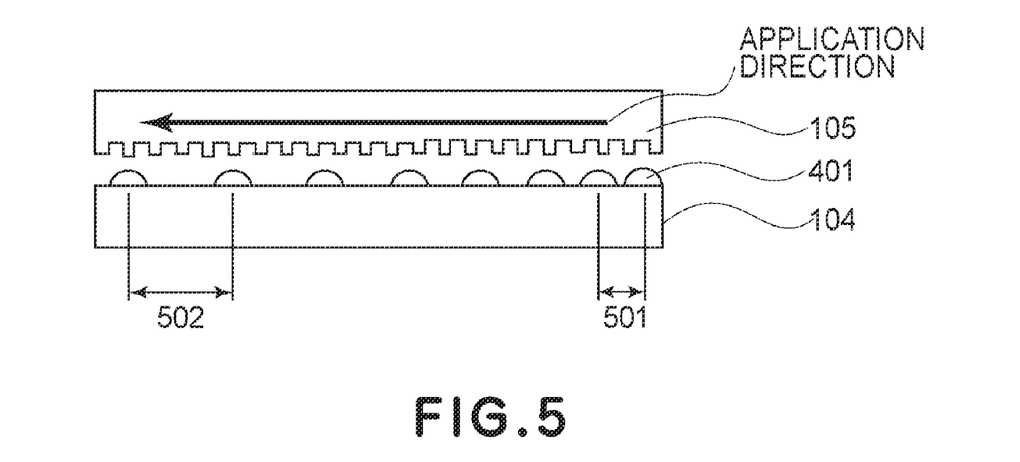

For example, when only one row is noted, as shown in FIG. 5, the equal amounts of droplets of the resin material 401 are successively applied from right to left on the drawing with gradually increased intervals of application positions. Thus, an application interval 501 is shorter than an application interval 502 depending on an evaporation amount until completion of the application.

In this embodiment, the equal row width may also be changed depending on the evaporation amount. Further, also in the case where the resin material is not applied in a shape of parallel rows, the application position of the resin material can be determined similarly depending on the evaporation amount.

The above described application method in this embodiment is also applicable to the case where the amount of the resin material applied on the substrate is not equal.

Figure 6:
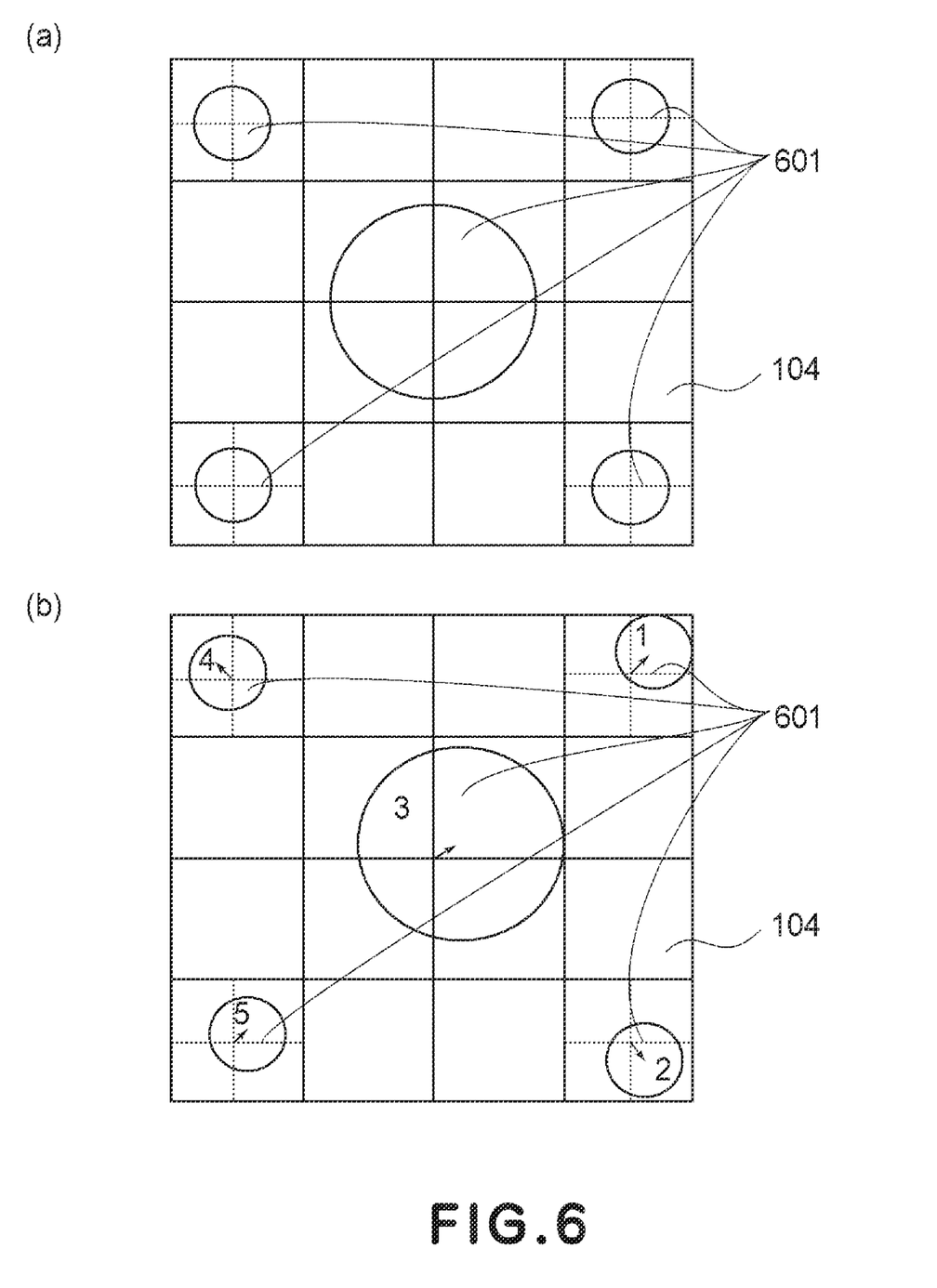

FIGS. 6(a) and 6(b) are schematic views for illustrating an example in which different amounts of droplets 601 of the resin material are applied.

As shown in FIG. 6(a), the case where only an amount of a central droplet applied at the center of the substrate 104 is increased for the reason that, e.g., bubbles less remain in the spacing between the substrate 104 and the mold 105 during the filling of the resin material will be considered.

When control of the application positions is performed in consideration of the evaporation amount during the application of the resin material as shown in FIG. 6(a), the respective application positions are changed as shown in FIG. 6(b). Reference numerals 1 to 5 in the resin material droplets 601 represent the order of application. In view of the evaporation amount, the resin material application is performed so that an arrangement of the resin material droplets is changed from a left-right and top-bottom symmetrical arrangement (FIG. 6(a)) to a shifted arrangement in which each droplet is shifted in a direction of an indicated arrow (FIG. 6(b)).

Next, a pattern transfer step in this embodiment will be described.

The substrate 104 onto which the resin material is applied is opposed to the mold 105, and the substrate 104 and the mold 105 are pressed against each other to fill the resin material in a spacing between the substrate 104 and the mold 105. At this time, a pressing pressure is detected by the load cell 106 and is controlled by using the pressure detection circuit 123, the pressure control circuit 124, and the stage 102.

Next, a positional relationship between the substrate 104 and the mold 105 is adjusted while the positions of the substrate 104 and the mold 105 are observed through the scope 107.

Then, the resin material is irradiated with UV light (rays) emitted from the UV light source 108 so as to be cured in the spacing between the substrate 104 and the mold 105.

Finally, the substrate 104 and the mold 105 are moved apart from each other to remove the cured resin material from the mold 105.

Through the above described processing steps, the surface imprint pattern of the mold 105 is transferred (imprinted) onto the resin layer on the work 104.

According to this embodiment, even in the case where a decrease in amount of the liquid resin material due to evaporation of the resin material is problematic, it is possible to fill the resin material in a necessary amount with no occurrence of excess and deficiency in resin material amount depending on location when the resin material is filled in the spacing between the substrate and the mold. As a result, precise processing can be performed.

Incidentally, an apparatus constitution regarding the application of the resin material is not limited to that described in this embodiment but may also be appropriately selectable. For example, it is also possible to effect the application of the resin material by using another apparatus.

Embodiment 2

In Embodiment 2, a constitution example employing a resin material application position control method other than that in Embodiment 1 will be described.

A difference from the Embodiment 1 is a constitution of the resin material application position control method, so that only a portion thereof will be described.

First, application positions of the resin material in a necessary amount causing no excess and deficiency in resin material amount depending on filling location when the resin material is filled in a spacing between the substrate 104 and the mold 105 is determined by the application position control circuit 126 in consideration of the shape of the mold 105.

Figure 7:
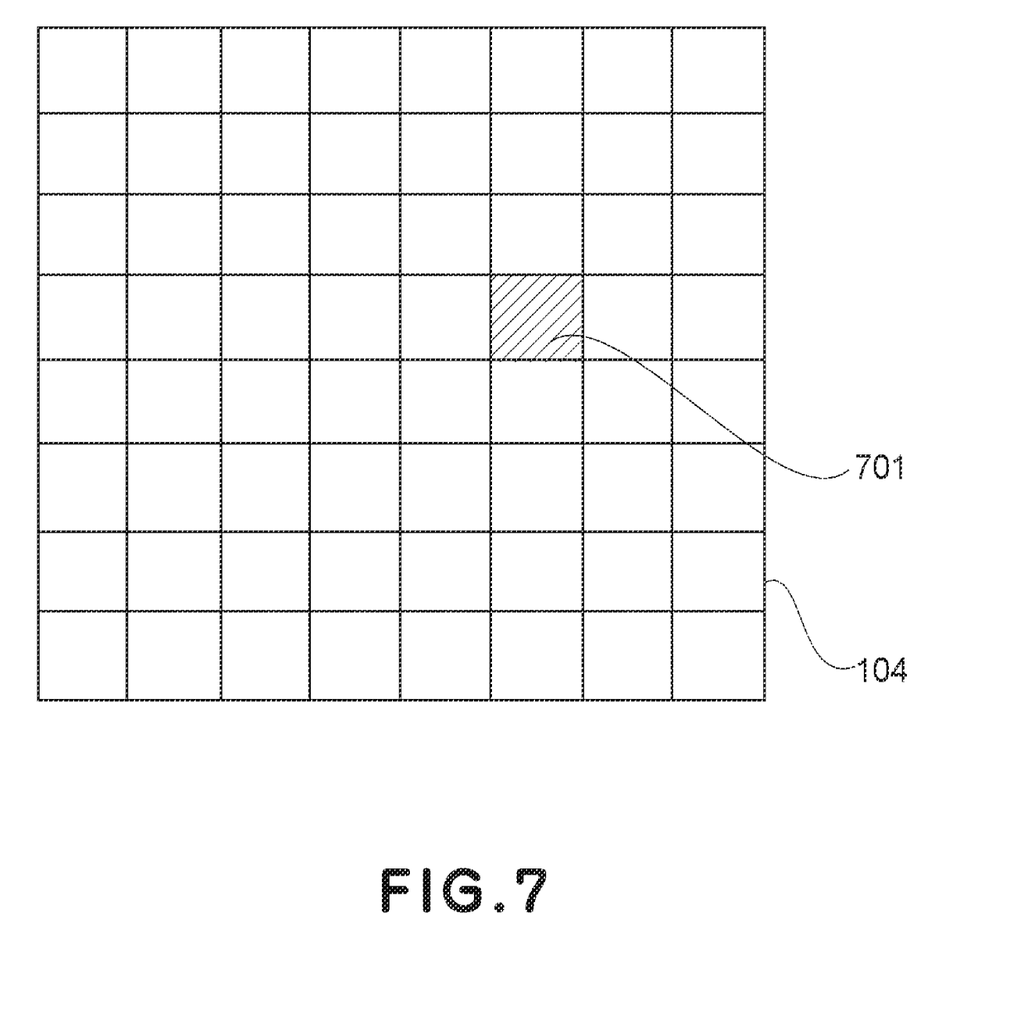
FIG. 7 is a schematic view for illustrating a constitution example of resin material application position control in Embodiment 2 of the present invention.

FIG. 7 is a schematic view for illustrating the constitution of this embodiment.

The application positions may, e.g., be determined in the following manner.

Similarly as in Embodiment 1, for the sake of simplicity, the case where an equal amount (1) of a droplet of the resin material is successively applied will be considered.

First, as shown in FIG. 7, an entire processing area is divided into n portions each having an equal planar dimension.

Next, e.g., in a k-th area 701, a necessary resin material amount $U_k$ is obtained from a shape of the mold in the area 701 and a desired thickness of a resin material layer.

Based on the necessary resin material amount $U_k$, a necessary number $N_k$ of resin material droplets can be represented by the following equation:

$$N_k = \frac{U_k}{l}.$$

As a result, the resin material application position in the k-th area 701 is determined. In this case, it is also possible to determine the resin material application position by further finely dividing the k-th area 701 into a plurality of portions.

A total resin material amount $V_{all}$ required for the processing can be represented by the following equation:

$$V_{all} = \sum_{k=1}^{n} U_k.$$

Based on the thus determined application position, the application position control circuit 126 provides instructions to the application control circuit 120 and the position control circuit 125, so that an equal amount of resin material droplet is successively applied by using the dispenser 109 and the stage 102 while the application position is controlled. Further, similarly as in Embodiment 1, the resin material application position may also be determined on the basis of an assigned area (planar dimension) for each resin material droplet depending on the mold shape.

Figure 8:
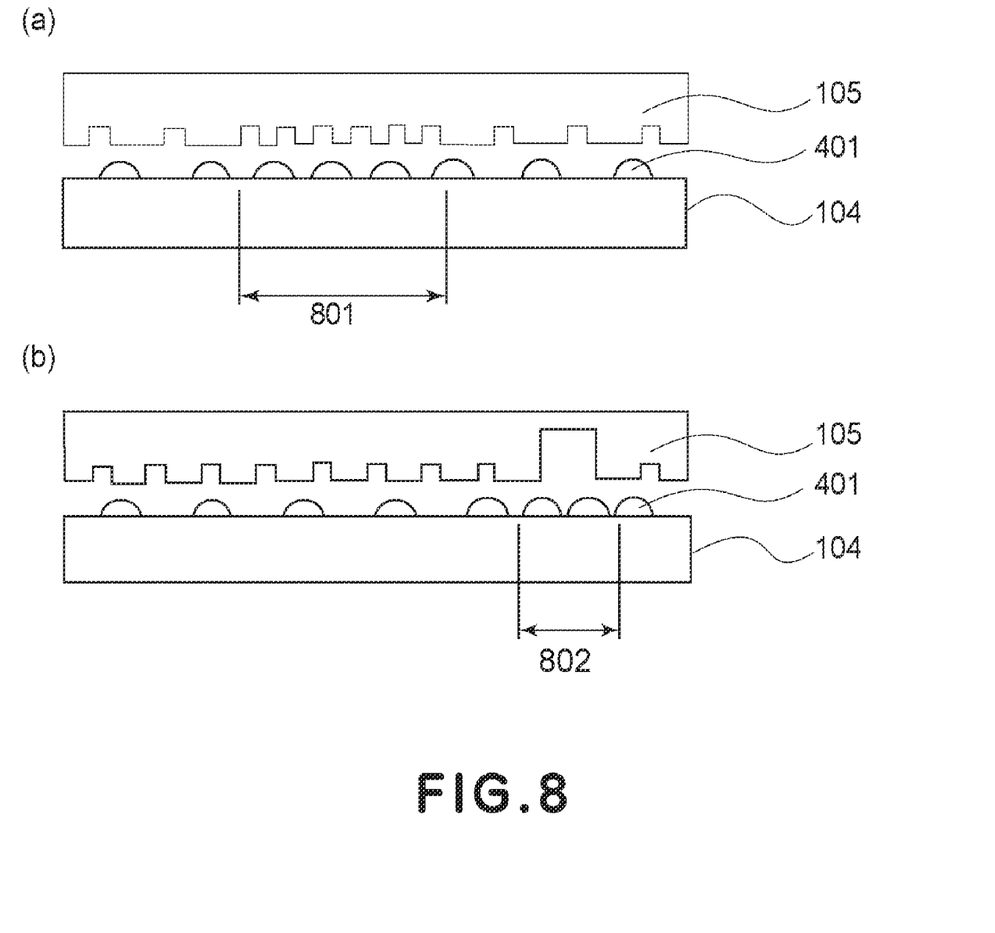
FIGS. 8(a) and 8(b) are schematic views each for illustrating a constitution example for effecting resin material application position control depending on a shape of a mold in the case where droplets of a resin material are applied in a line in Embodiment 2 of the present invention.

FIGS. 8(a) and 8(b) are schematic views each for illustrating the case of applying resin material droplets in a row shape in which control of the application position is effected depending on the mold shape.

FIG. 8(a) shows an example in which a necessary amount causing no excess and deficiency resin material amount depending on filling location is controlled by changing a difference in density of application positions on the substrate 104 depending on a difference in density of projections or recesses of the imprint pattern of the mold 105. In an area 801, the projections or recesses have a large density, so that the resin material is correspondingly applied at a short interval.

FIG. 8(b) shows an example in which a necessary amount causing no excess and deficiency resin material amount depending on filling location is controlled by changing a height or depth of application positions on the substrate 104 depending on a difference in density of projections or recesses of the imprint pattern of the mold 105. In an area 802, the projections or recesses have a large height or depth compared with other areas, so that the resin material is correspondingly applied at a short interval.

According to this embodiment, even in the case where the mold 105 has a complicated shape and localization of the necessary amount of the resin material at the respective application positions is problematic, it is possible to realize the necessary amount causing no excess and deficiency in resin material amount depending on filling location. As a result, precise processing can be performed. Incidentally, also in the case where localization of the necessary resin material amount for each application position due to strain of the substrate 104 is problematic, it is possible to realize the necessary amount causing no excess and deficiency in resin material amount depending on filling location by controlling the application position in consideration of the shape of the substrate 104. As a result, precise processing can be performed.

Figure 9:
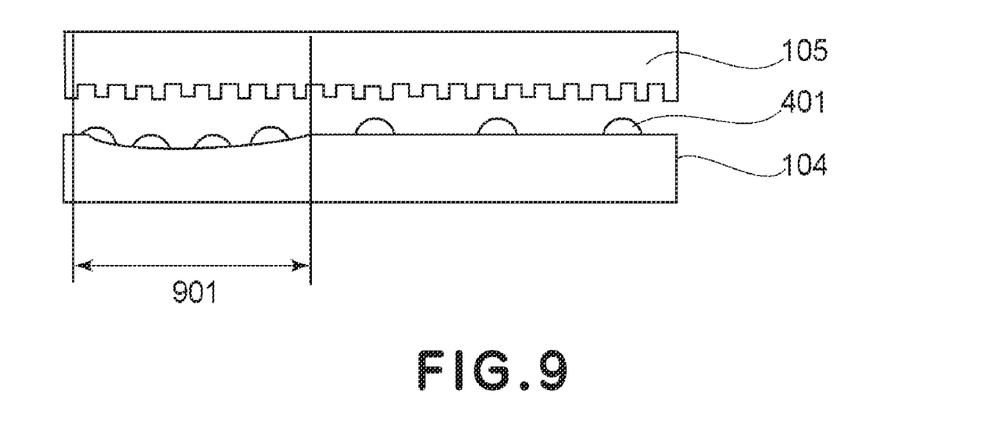
FIG. 9 is a schematic view for illustrating a constitution example of resin material application position, when a deformed substrate is used, in Embodiment 2 of the present invention.

FIG. 9 is a schematic view for illustrating an example of application positions of the resin material when a deformed substrate 104 is used.

In an area 901, the surface of the substrate 104 has a concave shape, so that the number of droplets is increased compared with those in other areas.

According to this embodiment, even in the case where a decrease in amount of the liquid resin material due to evaporation is problematic, the resin material application positions can be controlled by superposing a control amount of position depending on a degree of evaporation on a control amount depending on the mold shape or the substrate shape similarly as in Embodiment 1. As a result, it is possible to effect precise processing by realizing the necessary amount causing no excess and deficiency in resin material amount depending on filling location.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 151009/2006 filed May 31, 2006, which is hereby incorporated by reference.

What is claimed is:

1. A method for forming a pattern on a substrate by using a mold having an imprint pattern, the method comprising:
   dispensing in equal amounts an uncured pattern forming material onto the substrate in a dispersion state;
   deforming the uncured pattern forming material into a shape corresponding to the imprint pattern; and
   curing the deformed uncured pattern forming material,
   wherein the uncured pattern forming material is dispensed in a plurality of straight lines, which are spaced apart from and are parallel to each other,
   wherein a first droplet, a second droplet, and a third droplet of the uncured pattern forming material are successively dispensed at different spacial intervals in each of the straight lines without an intervening droplet being dispensed in another line, and
   wherein the spacial intervals are adjusted depending on an evaporation amount of the uncured pattern forming material so that a second spacial interval between the second droplet and the third droplet is longer than a first spacial interval between the first droplet and the second droplet in each of the straight lines.

2. The method according to claim 1, wherein the spacial intervals are re-adjusted depending on a density of projections and recesses of the imprint pattern of the mold, a depth or height of the projections and the recesses of the imprint pattern of the mold, or a strain of the substrate.

3. The method according to claim 1, wherein a line interval of the plurality of straight lines is adjusted depending on the evaporation amount of the uncured pattern forming material.

4. The method according to claim 1, wherein when the uncured pattern forming material is dispensed on a first straight line and then is dispensed on a second straight line, the first spacial interval on the second straight line is longer than a last spacial interval on the first straight line.

* * * * *